United States Patent
Baer

(10) Patent No.: US 8,387,687 B2
(45) Date of Patent: *Mar. 5, 2013

(54) METHOD AND APPARATUS FOR COOLING ELECTRONIC ENCLOSURES

(75) Inventor: Daniel B Baer, Delaware, OH (US)

(73) Assignee: Liebert Corporation, Columbus, OH (US)

( * ) Notice: Subject to any disclaimer, the term of this patent is extended or adjusted under 35 U.S.C. 154(b) by 532 days.

This patent is subject to a terminal disclaimer.

(21) Appl. No.: 11/308,267

(22) Filed: Mar. 14, 2006

(65) Prior Publication Data

US 2006/0180301 A1   Aug. 17, 2006

Related U.S. Application Data

(63) Continuation of application No. 09/814,495, filed on Mar. 21, 2001, now Pat. No. 7,051,802.

(60) Provisional application No. 60/190,881, filed on Mar. 21, 2000.

(51) Int. Cl.
  *G05D 23/00* (2006.01)
  *H05K 5/00* (2006.01)
  *F25D 23/12* (2006.01)

(52) U.S. Cl. .................. 165/299; 454/184; 62/259.2

(58) Field of Classification Search .......... 165/80.3, 165/80.4, 80.5, 299; 454/184; 62/259.2; 236/49.3; 361/699

See application file for complete search history.

(56) References Cited

U.S. PATENT DOCUMENTS

| | | |
|---|---|---|
| 3,005,321 A | 10/1961 | Devery |
| 3,253,646 A | 5/1966 | Koltuniak et al. |
| 3,317,798 A | 5/1967 | Chu et al. |
| 3,334,684 A | 8/1967 | Roush at al. |
| 3,749,981 A | 7/1973 | Koltuniak et al. |
| 3,754,596 A | 8/1973 | Ward, Jr. |
| 4,019,679 A | 4/1977 | Vogt et al. |
| 4,238,933 A | 12/1980 | Coombs |
| 4,240,499 A | 12/1980 | Kals |
| 4,308,042 A | 12/1981 | Ecker |
| 4,315,300 A | 2/1982 | Parmerlee et al. |
| 4,495,780 A | 1/1985 | Kaneko et al. |
| 4,514,746 A * | 4/1985 | Lundqvist ............ 361/698 |
| 4,756,164 A | 7/1988 | James et al. |
| 4,911,231 A | 3/1990 | Horne et al. |
| 5,035,628 A | 7/1991 | Casciotti et al. |

(Continued)

FOREIGN PATENT DOCUMENTS

| | | |
|---|---|---|
| DE | 19804901 A | 8/1999 |
| DE | 29908370 | 9/1999 |

(Continued)

OTHER PUBLICATIONS

Klingeberg, G.: "Kombination Spart Strom bei der Schaltschrank-klimatisierung" Elekotrotechnik, Vogel Verley K. G., Wurzburg DE, Nov. 5, 1998.

(Continued)

*Primary Examiner* — Ljiljana Ciric
(74) *Attorney, Agent, or Firm* — Locke Lord LLP

(57) ABSTRACT

An enclosure containing heat-producing equipment includes an air inlet for admitting air from an environment containing the enclosure. The equipment is situated relative to the air inlet such that the air absorbs heat from the equipment, increasing the temperature of the air. An air-to-liquid heat exchanger is mounted on an outside surface of the enclosure adjacent to an air outlet. The heat exchanger is connectable to an external cooling source such that heat from the heated air exiting the enclosure absorbed by the heat exchanger is expelled outside the environment containing the enclosure.

9 Claims, 7 Drawing Sheets

U.S. PATENT DOCUMENTS

| | | |
|---|---|---|
| 5,054,542 A | 10/1991 | Young et al. |
| 5,123,478 A | 6/1992 | Hosaka |
| 5,150,277 A | 9/1992 | Bainbridge |
| 5,161,087 A | 11/1992 | Frankeny et al. |
| 5,220,809 A | 6/1993 | Voss |
| 5,261,251 A | 11/1993 | Galiyano |
| 5,273,438 A | 12/1993 | Bradley et al. |
| 5,329,425 A | 7/1994 | Leyssens et al. |
| 5,335,508 A | 8/1994 | Tippmann |
| 5,376,008 A | 12/1994 | Rodriguez |
| 5,395,251 A | 3/1995 | Rodriguez et al. |
| 5,400,615 A | 3/1995 | Pearson et al. |
| 5,402,313 A | 3/1995 | Casperson et al. |
| 5,410,448 A | 4/1995 | Barker et al. |
| 5,414,591 A | 5/1995 | Kimura |
| 5,467,607 A | 11/1995 | Harvey |
| 5,471,850 A | 12/1995 | Cowans |
| 5,522,452 A | 6/1996 | Mizuno et al. |
| 5,570,740 A | 11/1996 | Flores et al. |
| 5,603,375 A | 2/1997 | Salt |
| 5,657,641 A | 8/1997 | Cunningham et al. |
| 5,673,029 A | 9/1997 | Behl et al. |
| 5,709,100 A | 1/1998 | Baer et al. |
| 5,718,628 A | 2/1998 | Nakazato et al. |
| 5,740,018 A | 4/1998 | Rambut, Jr. |
| 5,847,927 A | 12/1998 | Minning et al. |
| 6,024,165 A | 2/2000 | Melane et al. |
| 6,026,891 A | 2/2000 | Fujiyoshi et al. |
| 6,046,908 A | 4/2000 | Feng |
| 6,115,242 A | 9/2000 | Lambrecht |
| 6,148,626 A | 11/2000 | Iwamoto |
| 6,158,502 A | 12/2000 | Thomas |
| 6,167,948 B1 | 1/2001 | Thomas |
| 6,185,098 B1 | 2/2001 | Benavides |
| 6,205,796 B1 | 3/2001 | Chu et al. |
| 6,205,803 B1 | 3/2001 | Scaringe |
| 6,208,510 B1 | 3/2001 | Trudeau et al. |
| 6,258,293 B1 | 7/2001 | Iizuka et al. |
| 6,299,526 B1 | 10/2001 | Cowan et al. |
| 6,305,180 B1 | 10/2001 | Miller et al. |
| 6,310,773 B1 | 10/2001 | Yusuf et al. |
| 6,416,330 B1 | 7/2002 | Yatskov |
| 6,435,266 B1 | 8/2002 | Wu |
| 6,515,862 B1 | 2/2003 | Wong et al. |
| 6,519,955 B2 | 2/2003 | Marsala |
| 6,550,530 B1 | 4/2003 | Bilski |
| 6,557,624 B1 | 5/2003 | Stahl et al. |
| 6,564,858 B1 | 5/2003 | Stahl |
| 6,628,520 B2 | 9/2003 | Patel et al. |
| 6,644,384 B2 | 11/2003 | Stahl |
| 6,679,081 B2 | 1/2004 | Marsala |
| 6,742,345 B2 | 6/2004 | Carr |
| 6,772,604 B2 | 8/2004 | Bash et al. |
| 6,827,135 B1 | 12/2004 | Kramer et al. |
| 6,881,141 B2 | 4/2005 | Knight |
| 6,992,889 B1 | 1/2006 | Kashiwagi et al. |
| 6,999,316 B2 | 2/2006 | Hamman |
| 7,051,802 B2 | 5/2006 | Baer |
| 7,236,359 B2 | 6/2007 | Strobel |
| 7,469,555 B2 | 12/2008 | Taras et al. |
| 2001/0042616 A1 | 11/2001 | Baer et al. |
| 2001/0052412 A1 | 12/2001 | Tikka |
| 2002/0039280 A1 | 4/2002 | O'Connor et al. |
| 2002/0066280 A1 | 6/2002 | Ohkawara |
| 2002/0117291 A1 | 8/2002 | Cheon |
| 2002/0124585 A1 | 9/2002 | Bash et al. |
| 2002/0184908 A1 | 12/2002 | Brotz et al. |
| 2003/0010477 A1 | 1/2003 | Khrustalev et al. |
| 2003/0051859 A1 | 3/2003 | Chesser et al. |
| 2003/0126872 A1 | 7/2003 | Harano et al. |
| 2003/0147216 A1 | 8/2003 | Patel et al. |
| 2003/0182949 A1 | 10/2003 | Carr |
| 2004/0025516 A1 | 2/2004 | Van Winkle |
| 2004/0100770 A1 | 5/2004 | Chu |
| 2004/0184233 A1 | 9/2004 | Yamada |
| 2005/0120737 A1 | 6/2005 | Borror et al. |
| 2005/0168945 A1 | 8/2005 | Coglitore |
| 2006/0101837 A1 | 5/2006 | Manole |
| 2006/0102322 A1 | 5/2006 | Madara et al. |

FOREIGN PATENT DOCUMENTS

| | | |
|---|---|---|
| EP | 1357778 | 10/2003 |
| GB | 2113012 A | 7/1983 |

OTHER PUBLICATIONS

European Communication for European Patent Application No. 04812840.9.

Pearson, S.F. et al., "Development of Improved Secondary Refrigerants." The Proceedings of The Institute of Refrigeration, vol. 89, pp. 65-80, 1992, United Kingdom.

Baer, D.B. "Emerging Cooling Requirements & Systems in Telecommunications Spaces." Telecommunications Energy Conference 2001, Oct. 14-18, 2001, p. 95-100.

Vogel, Marlin et al. "Low Profile Heat Sink Cooling Technologies for Next Generation CPU Thermal Designs." Electronic Cooling Online, Feb. 17, 2005, 11 pages.

Webb, Warren. "Take the heat: Cool that hot embedded design." EDN, May 13, 2004, 5 pages.

JAMSTEC/Earth Simulator Center, "Processor Node (PN) Cabinet." one page. http://www.es.jamstec.go.jp/esc/eng/Hardware/pnc.html [accessed Mar. 5, 2004].

Hannemann, Robert et al. "Pumped Liquid Multiphase Cooling." ASME, 2004, IMECE 2004, Paper IMECE2004-60699, Anaheim, California, 5 pages.

"Thermal Form & Function—Rack Cooling System (RCS)." Thermal Form & Function LLC, 2005, Manchester, MA, one page. http://www.thermalformandfunction.com/racksystem.html [accessed May 11, 2006].

Pitasi, M. "Thermal Management System Using Pumped Liquid R-134a with Two Phase Heat Transfer." Thermal Form & Function LLC, Mar. 2002, Manchester, MA, pp. 1-9. http://www.coolingzone.com/Guest/News/NL_MAR_2002/TFF/Tff.html.

Marsala, Joe. "Pumped Liquid/Two Phase Cooling for High Performance Systems." Thermal Form & Function LLC, May 13, 2003, Scottsdale, Arizona, 19 pages.

"Managing Extreme Heat Cooling Strategies for High-Density Computer Systems." Liebert Corporation, Dec. 7, 2003, Columbus, Ohio, 16 pages.

Emerson Network Power—Liebert Foundation; "Protection for Today's Needs . . . and Tomorrow's Opportunities; Enclosure Systems." 2003, p. 1-16.

Emerson Network Power—Liebert Foundation; "Wall Mount Equipment Enclosures Designed for Tight Spaces." 2003, p. 1-2.

European Search Report for Counterpart EPO04812840, Jul. 6, 2007, 3 pages.

International Search Report for Corresponding International Patent Application No. PCT/US2005/040745.

Written Opinion of the International Searching Authority for Corresponding International Patent Application No. PCT/US2005/040745.

International Search Report for Corresponding International Patent Application No. PCT/US2006/028088.

Written Opinion of the International Searching Authority for Corresponding International Patent Application No. PCT/US2006/028088.

International Search Report for Corresponding International Patent Application No. PCT/US2004/040407.

Written Opinion of the International Searching Authority for Corresponding International Patent Application No. PCT/US2004/040407.

\* cited by examiner

METHOD AND APPARATUS FOR COOLING ELECTRONIC ENCLOSURES

CROSS-REFERENCE TO RELATED APPLICATIONS

This application is a continuation of U.S. patent application Ser. No. 09/814,495, filed on Mar. 21, 2001, which claims the benefit of U.S. Provisional Patent Application No. 60/190,881, filed on Mar. 21, 2000, both of which are incorporated by reference.

BACKGROUND

The present invention relates generally to cooling systems for enclosures housing electronic equipment.

With the expansion of telecommunication and computer technology, increasing amounts of electronic equipment are required at various commercial and business facilities. To facilitate interconnection and access to such equipment, it is typically installed in a common room. Further, technological advancements are permitting more and more electronic equipment to be fit into increasingly smaller spaces. These forces are combining to produce relatively dense electronic installations that generate increasing amounts of heat. For such equipment to operate properly, and to maintain comfort for persons operating and working on such equipment, it is necessary to provide a relatively stable and comfortable temperature and humidity. This has typically been accomplished through the use of air conditioning.

As the density of electronic equipment has increased, it has become increasingly difficult to remove the heat introduced by the electronics from the rooms where such equipment is operated using the conventional room air conditioning alone. It has therefore become necessary to install additional localized cooling for enclosures containing electronic equipment that will remove the heat generated by the electronic equipment from the room, thereby minimizing or eliminating the heat load on the air conditioning equipment.

The present application addresses shortcomings associated with the prior art.

SUMMARY

The present invention is an apparatus and method for removing heat generated by the electronics within an enclosure from the room containing such enclosure, thereby reducing or eliminating the heat load from the conventional room air conditioning system. In fact, using the present invention it is possible to supplement the cooling capacity of the room air conditioning system to promote efficient operation.

The principle of operation of the present system is as follows: Air from the computer room at the ambient temperature and humidity is taken into the enclosure and heated by the electronic equipment. The air is then expelled through a heat exchanger, which cools the air back to the ambient temperature. The exiting air is cooled using an external source of chilled water, glycol or a suitable dielectric fluid, which is typically readily available in commercial installations. By returning the air exiting the enclosure to the ambient temperature in the room, the load on the room air conditioning is reduced or eliminated. Furthermore, the cooling fluid provides a more efficient heat transfer medium for removing heat from the room than the room air, as would be the case with a conventional prior art cooling system.

In accordance with one aspect of the present invention, there is provided a cooling system for an enclosure. The enclosure contains equipment that produces heat and is disposed in a room having ambient air. The cooling system includes a heat exchanger attached to the enclosure. The room air enters the enclosure and absorbs heat from the equipment in the enclosure. The heat exchanger absorbs heat from the air and returns the air to the room at substantially the same ambient conditions of the ambient air in the room.

In accordance with another aspect of the present invention, there is provided a mechanism for moving air from the enclosure, through the heat exchanger, and back into the room.

In accordance with one aspect of the present invention, there is provided an enclosure in a computer room. The enclosure contains electronic equipment that produces a heat load. The enclosure includes an inlet for the ambient air from the computer room and an outlet for the heated air in the enclosure. The air absorbs the heat load from the electronic equipment. A heat exchanger adjacent to the outlet of the enclosure absorbs the heat load from the air in the enclosure. The air returns to the computer room at substantially the same ambient conditions as the ambient air in the computer room.

In accordance with one aspect of the present invention, there is provided a method for cooling an enclosure in a computer room. The enclosure contains electronics that produce a heat load. The method includes absorbing the heat load of the electronics by passing the air from the computer room over the electronics in the enclosure. The method further includes absorbing the heat from the heated air by passing the heated air through a heat exchanger. The heat exchanger expels the absorbed heat outside the computer room, while returning the cooled air to the computer room.

In accordance with one aspect of the present invention, there is provided a cooling apparatus for an enclosure disposed in a computer room. The enclosure contains equipment producing heat. The cooling system includes a rack mount in the enclosure. An airflow mechanism is installed in the enclosure, which draws air through the enclosure where the air absorbs heat from the equipment. A heat exchanger installs in the rack mount. The heat exchanger is in fluid association with an external cooling source outside the computer room. The heat exchanger absorbs heat from the air passing through the heat exchanger. The enclosure, therefore, presents a small to non-existent heat load to the computer room in which it is disposed.

BRIEF DESCRIPTION OF THE DRAWINGS

The foregoing, the preferred embodiment, and other aspects of the present invention will be best understood with reference to the detailed description of specific embodiments of the invention, which follows, when read in conjunction with the accompanying drawings, in which.

Figure 1:
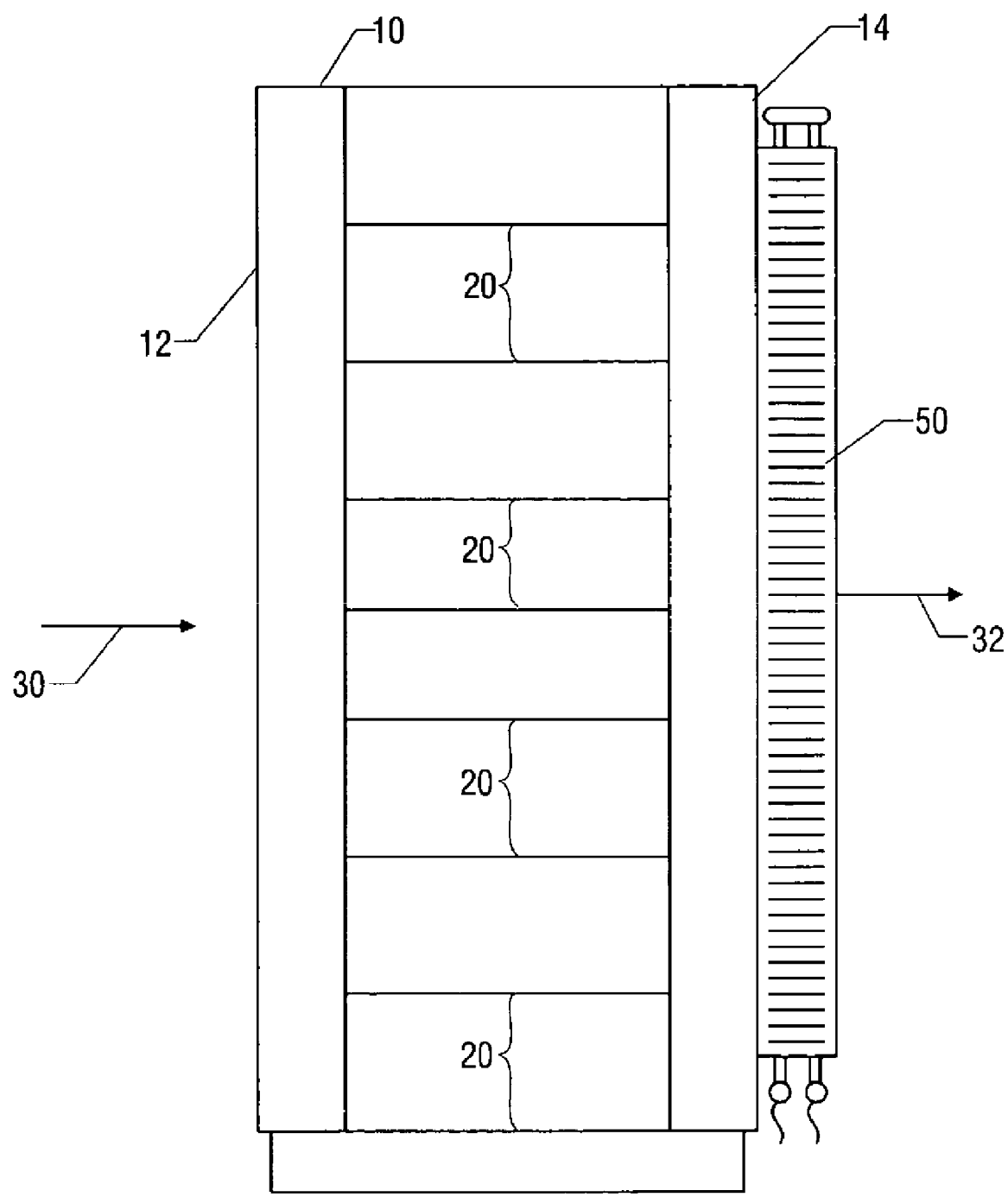
FIG. 1 shows a side view of an electronic equipment enclosure and cooling system in accordance with the present invention.

While the present invention is susceptible to various modifications and alternative forms, specific embodiments are shown by way of example in the drawings and are described in detail herein. However, it should be understood that the invention is not limited to the particular forms disclosed. Rather, the invention includes all modifications, equivalents and alternatives within the scope of the appended claims.

DETAILED DESCRIPTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

An apparatus in accordance with the present invention is illustrated in FIG. 1. Electronic equipment, such as computer or telecommunication devices, is housed in a rack enclosure 10. Rack enclosure 10 contains a plurality of equipment mounting racks 20. Mounting racks 20 hold various computer and electronic equipment. Cooling fans integral to the computer equipment draw air 30 from the room, through the front 12 of enclosure 10. The air passes over the electronic equipment mounted in racks 20 and absorbs the heat generated by the electronics. The air 32 flows out the back 14 of enclosure 10 and back into the computer room.

Because the air used to cool the electronic equipment is returned to the room, the room air conditioning equipment must have adequate capacity to absorb the heat rejected to the room air by the computer equipment. The power dissipation of a typical rack system in use today is approximately 8 kW. However, with the trend of increasingly smaller and faster computer and electronic devices, it is anticipated that a typical rack system will dissipate 15 kW of heat within the next few years. Given the number of such rack systems installed in computer rooms, it is becoming increasingly difficult to cool the room air sufficiently to absorb the heat produced by the electronic equipment.

It is therefore preferable to have a means of cooling that does not reject heat into the computer room, such as the present invention. Turning again to FIG. 1, heat exchanger 50 is mounted on the rear 40 of rack enclosure 10. As discussed above, air 30 is drawn from the room through the front 30 of rack enclosure 10. The air passes over the electronic equipment mounted in racks 20 and through heat exchanger 50. Heat exchanger 50 absorbs the heat added to the air by the electronic equipment, thereby eliminating the additional heat load to the room air conditioning system. The air 32 then returns to the computer room.

In a typical embodiment of the present invention, the ambient air in the computer room would be at a temperature of 75 degrees Fahrenheit. The rack mounted electronic equipment would add heat to this air raising its temperature to a typical value of 95 degrees Fahrenheit. To present a neutral heat load to the computer room air conditioning system, the heat exchanger must absorb all of the heat added to the air, thereby reducing its temperature to the 75 degrees ambient temperature of the computer room. This heat is then rejected into a source of chilled water, glycol, dielectric fluid or other fluid, which is typically available in buildings where such equipment is housed.

It may be desirable to isolate the cooling fluid used in the cooling device of the present invention from the cooling fluid provided by the external source. For example, the building housing the rack cooler may use chilled water as a cooling fluid. It may then be desirable to use a different cooling fluid with different dielectric properties, within the present invention. The use of a fluid having different dielectric properties will prevent catastrophic damage to the electronic equipment in case of a leak. Furthermore, the amount of isolated cooling fluid required for the rack cooler is limited, meaning less fluid would escape if a leak were to occur.

Isolating the cooling fluid used in the present invention from the cooling fluid of the source may be readily accomplished using a fluid to fluid heat exchanger, as is known in the art. The fluid to fluid heat exchanger may use pumps, valves, sensors and controller to ensure the temperature exchange between the cooling fluid of the source and the cooling fluid in the rack cooler. Additionally, by isolating the cooling fluid used in the present invention, the pressure of the isolated cooling fluid may be controlled. The pressure of the isolated cooling fluid may be made equal to atmospheric pressure minus the head pressure of the cooling fluid. If a leak were to occur in the present invention, air would enter through the leak, and the isolated cooling fluid would be prevented from escaping.

Figure 2:
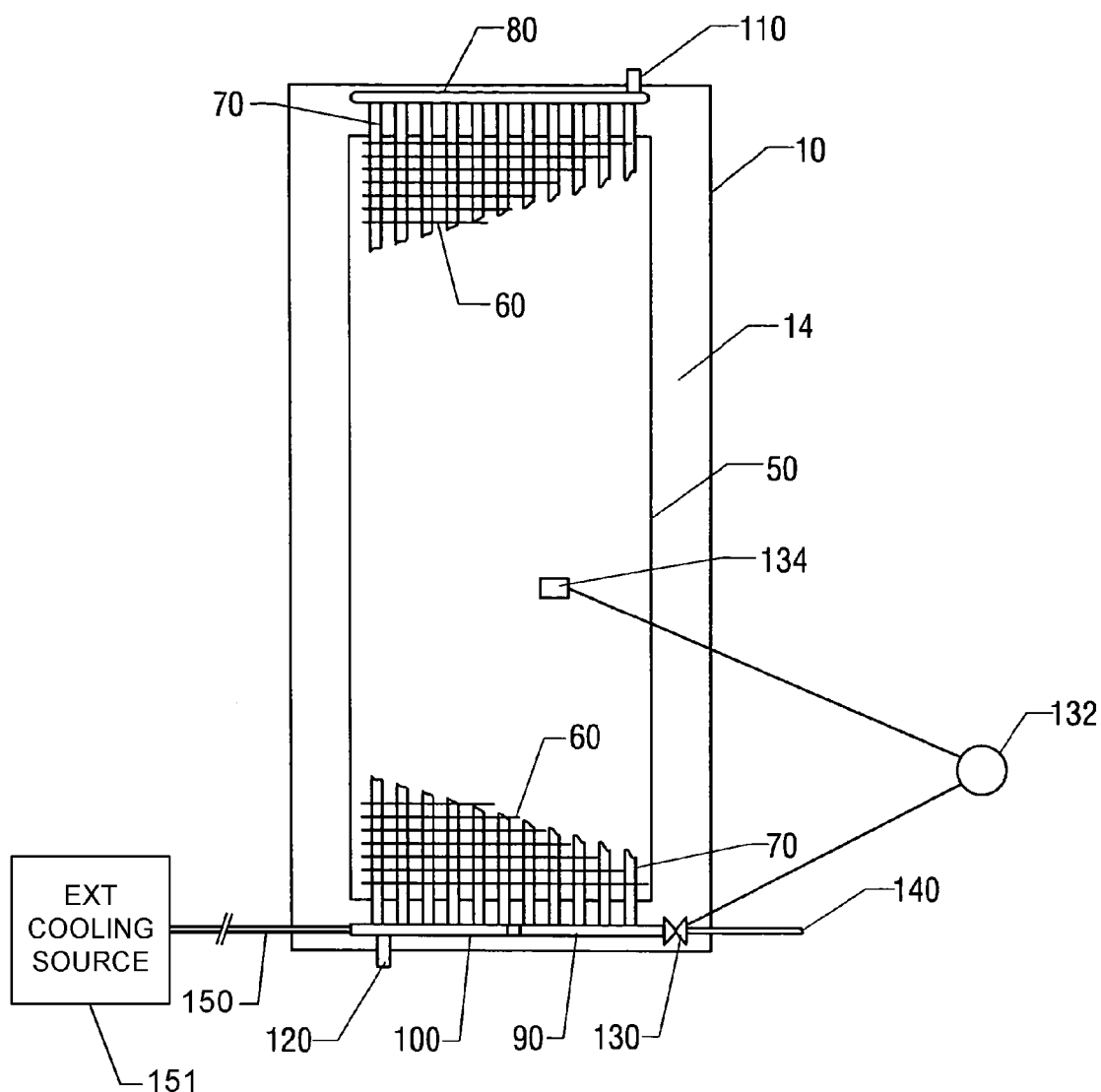
FIG. 2 shows the rear view of the electronics enclosure, which presents a face-on view of the cooling system of the present invention.

The construction of heat exchanger 50 is illustrated in FIG. 2. Heat exchanger 50 is mounted on the back of enclosure 14. The heat exchanger is made up of a number of cooling tubes 70 that pass through cooling fins 60. Chilled water, glycol, dielectric fluid or another cooling fluid from source 140 enters the heat exchanger through modulating valve 130. Modulating valve 130 is operated by a temperature controller 132 to ensure that the air exiting the heat exchanger is at the same temperature as the room temperature of the computer room in which the equipment is housed. Temperature controller 132 may have a temperature sensor 134 on the back of heat exchanger 50 to measure the temperature of the air leaving the heat exchanger. The chilled cooling fluid then passes into inlet header 90.

From inlet header 90, the chilled cooling fluid passes upward through cooling tubes 70, which are in thermal contact with fins 60. Air that has been heated by the electronic equipment is flowing through the heat exchanger in a direction parallel to the plane of the fins 60 and perpendicular to the cooling tubes 70. The fluid passing through tubes 70 absorbs heat from the air. The cooling fluid then reaches top header 80 at the top of the heat exchanger and returns downward through another set of cooling tubes 70. The fluid absorbs additional heat from the airflow across the electronic components and reaches the outlet header 100 located at the bottom of heat exchanger 50. The cooling fluid, now heated is returned through fluid return 150. The cooling fluid flows to an external cooling source 151 that rejects the heat absorbed by the fluid outside the computer room. The external cooling source 151 may be a chiller or a second heat exchanger. The chilled fluid is then returned to the inlet 140, operating the cycle continuously.

A preferred embodiment of the cooling system of the present invention includes vent 110 located at the top header 80 of heat exchanger 50. This vent provides a mechanism whereby the air present in the cooling tubes 70 may be expelled from the system when the heat exchanger is charged with cooling fluid. The preferred embodiment also includes drain 120, located at either the inlet header 90 or outlet header 100 at the bottom of heat exchanger 50. This drain provides means whereby the cooling fluid may be drained from the heat exchanger tubes 70 as required for maintenance purposes.

Figure 3:
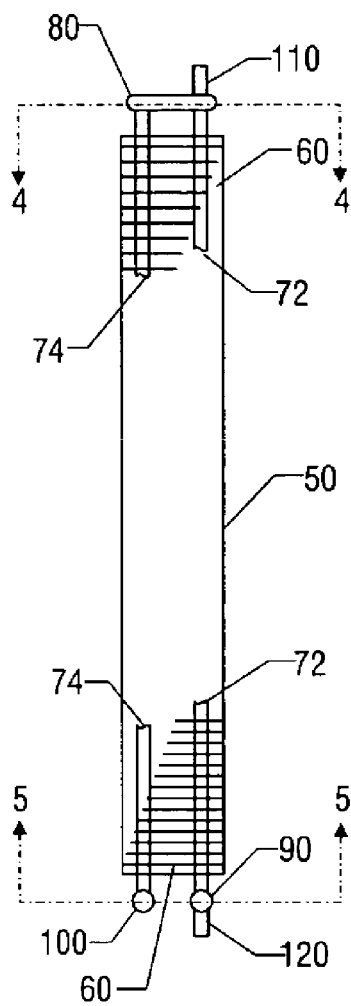
FIG. 3 shows an enlarged side view of a cooling system in accordance with the present invention.
Figure 4:
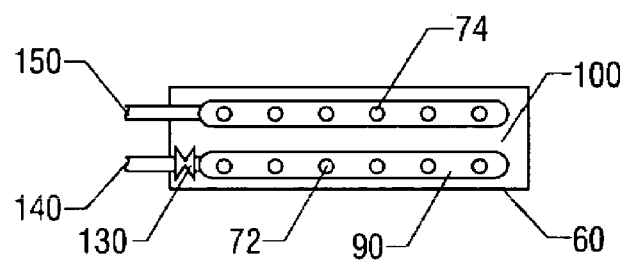
FIG. 4 illustrates a bottom view of the heat exchanger piping used in the present invention.
Figure 5:
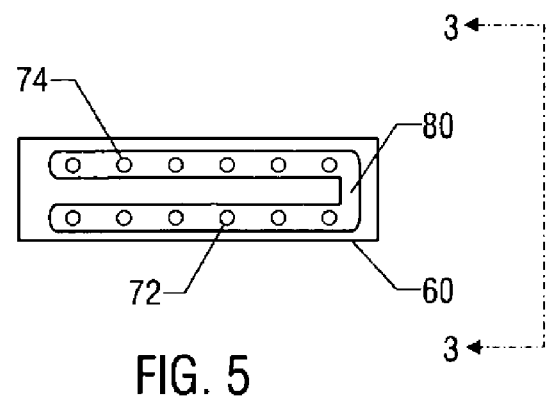
FIG. 5 shows a top view of the heat exchanger piping used in the present invention.

FIG. 3, in conjunction with FIG. 4 and FIG. 5, illustrates the flow of cooling fluid through the apparatus of the present invention. Turning to FIG. 4, a bottom view of the heat exchanger is shown. The cooling fluid enters the heat exchanger from cooling fluid source 140. The flow of cooling fluid is modulated by valve 130 to regulate the amount of cooling fluid passing through the exchanger, which in turn controls the amount of heat absorbed and the temperature of the exiting air. The cooling fluid then enters inlet header 90 and passes upward through cooling tubes 72.

Turning now to FIG. 3, a side view of the heat exchanger is shown. The fluid passes upward through cooling tubes 72, which are in thermal contact with cooling fins 60. Airflow through the apparatus is in a direction from left to right in the plane of the page. The cooling fluid then reaches top header 80, which is more clearly illustrated by FIG. 5. In the top header of FIG. 5, the fluid comes up through cooling tubes 72 and flows around to pass downward through cooling tubes 74. Fluid flow is in a counter clockwise direction through top header 80, although the header could be constructed in various fashions. Furthermore, the device could be constructed without the top header, with the connection between the upward cooling tubes and the corresponding downward cooling tubes being made by a series of hairpin bends. Returning to FIG. 3, the cooling fluid passes downward through cooling tubes 72 and returns to outlet header 100, which is more clearly illustrated in FIG. 4. As can be seen, the cooling fluid passes through outlet header 100 to cooling fluid return piping 150.

In addition to providing a cooling means for electronic equipment that is heat neutral to the room air conditioning, the present invention has an additional advantage in that it prevents condensation on or near the electronic equipment. Prior art cooling systems for electronic enclosures cooled the air entering the enclosure, which then passed over the electronic equipment and was heated back to the room air temperature by the electronics.

It is well known to those skilled in the art that the amount of water that the air can hold decreases significantly with a decrease in temperature. For example, a typical computer room installation would have an ambient condition of 75 degrees Fahrenheit and a relative humidity of 50 percent. Using standard psychometric calculations, it can be shown that this corresponds to an absolute humidity of approximately 0.009 pounds of water per pound of air. Cooling this air to a temperature of 55 degrees Fahrenheit increases the relative humidity to 100 percent, meaning condensation is imminent. This condensation will take place inside the computer rack enclosure, which poses significant risk to the electronic equipment. Furthermore, if the enclosure is opened, the influx of warm, relatively moist air will virtually guarantee condensation on the electronic equipment.

Conversely, using the present invention, the ambient air enters the enclosure at a typical temperature of 75 degrees Fahrenheit and a typical relative humidity of 50 percent. The air is heated by the electronic components to a typical temperature of 95 degrees Fahrenheit. This decreases the relative humidity of the air to approximately 26 percent. When the heat is removed by the heat exchanger, the relative humidity again increases to a typical value of 50 percent. Because the air is always contains a relatively low amount of water as compared to saturation, the possibility of condensation is virtually non-existent.

The cooling technique of the present invention has the added advantage of allowing the use of a relatively warmer cooling fluid. To efficiently transfer heat from the heated air to the cooling fluid, it is typically necessary to maintain a temperature differential of 10 degrees Fahrenheit or more between the lowest air temperature and the temperature of the cooling fluid. This temperature differential is required to achieve significant heat transfer between the heated air and the cooling fluid. In the typical prior art embodiment discussed above, this would require cooling fluid at an initial temperature of 45 degrees Fahrenheit to cool the entering 75 degrees Fahrenheit air to 55 degrees Fahrenheit. Conversely using a typical embodiment of the present invention, the cooling fluid temperature need only be approximately 65 degrees Fahrenheit. This increased temperature of the cooling fluid is advantageous in that it enables the mechanism for cooling the fluid to operate more efficiently and it also reduces the probability of condensation on any of the cooling fluid lines.

In another preferred embodiment of the present invention, a separate means may be provided to force air through the heat exchanger, which allows the cooling device of the present invention to absorb greater quantities of heat. As the required amount of heat absorption increases, it becomes necessary to increase the thickness of the heat exchanger, increasing the length of the air path through the cooling fins. This increased obstruction to air flow results in a greater air pressure drop across the heat exchanger. As the pressure drop increases, the velocity of the air decreases, ultimately reducing the amount of heat that the air can absorb from the electronic equipment. As a result, it is beneficial to provide a means of increasing airflow through the heat exchanger to supplement the air flow generated by the electronic equipment's integral cooling fans.

Various air flow means that may be added include centrifugal blowers, cross-flow blowers, axial fans, plug fans, and other equivalents that are known in the art. Each fan type has its own performance advantages and disadvantages. For example, construction using axial fans would be expensive to implement. Axial fans also run relatively slowly, thus limiting the airflow increase that can be obtained. Centrifugal blowers are relatively inexpensive to implement and relatively efficient. The airflow path of cross flow blowers minimizes the space required to generate proper airflow across the heat exchanger. Cross flow blowers are also fairly quiet and provide large air volume throughput at relatively low speeds. Plug fans, also known as backward curved motorized impellers, provide very low sound levels, which is important when numerous devices are to be installed in a single room. Plug fans also have very low power consumption levels and are relatively efficient to operate. Whatever the design of the fan, it is preferable to use multiple fans in each cooling device so that failure of any single fan will not compromise system performance.

Figure 6A:
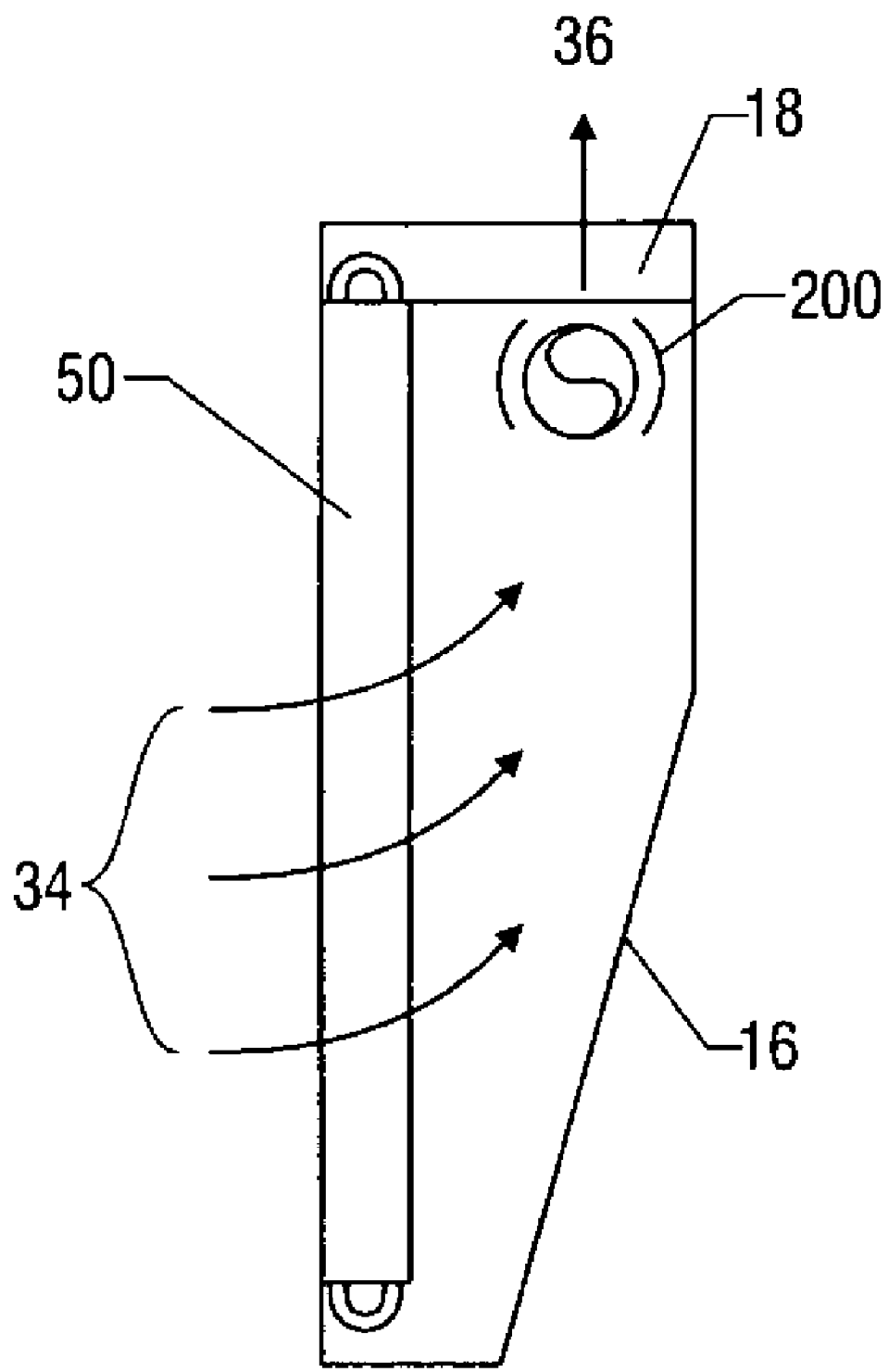
FIG. 6A-6B illustrate embodiments of the present invention, including an airflow inducing mechanism.

FIG. 6A illustrates an embodiment of the present invention, implementing an airflow means. A side view of heat exchanger 50 is shown attached to back 14 of enclosure 10. An extension or additional chamber 16 attaches to the back 14 and encompasses heat exchanger 50. Extension 16 has an outlet 18 for air. An air circulator or fan 200 situates within extension 16 and adjacent outlet 18. Drawn by fan 200, air 34 flows from within the enclosure and through heat exchanger 50 where cooled. Finally, cooled air 36 exits outlet 18 and returns to the room. It is understood that a number of air circulators, such as those described above, may sufficiently draw air through the heat exchanger, and therefore, selection of the appropriate mechanism lies within the discretion of one having ordinary skill in the art.

Figure 6B:
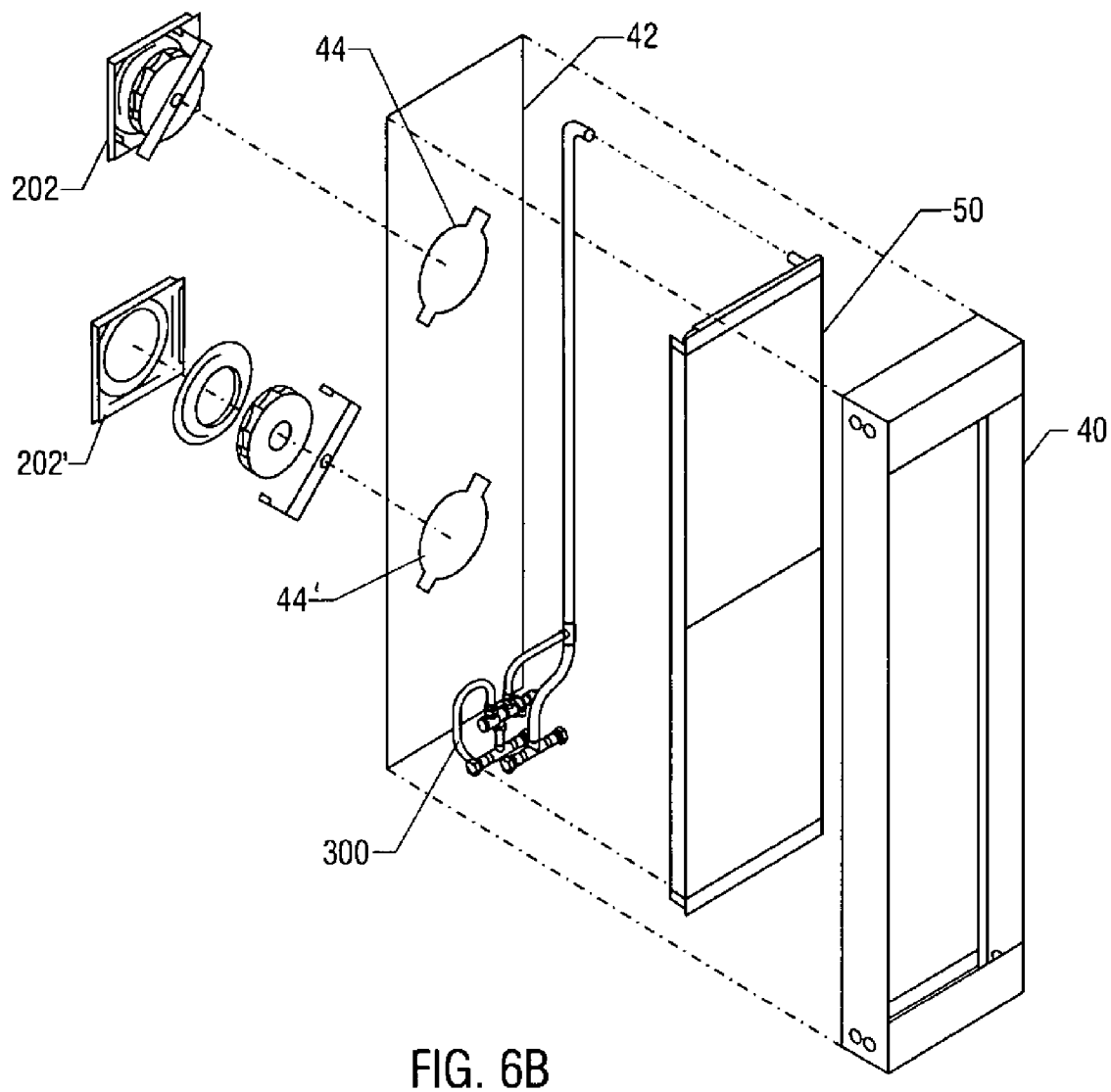

FIG. 6B illustrates an embodiment of a heat exchanger with fans according to the present invention. Heat exchanger 50 installs in an attachment enclosure 40. Necessary piping and valves 300, further described below, connect to heat exchanger 50. A panel 42 then attaches to attachment enclosure 40. Panel 42 has a plurality of openings 44, 44' to receive fans 202, 202'. The fans may be, for example, propeller or plug fans, as these fans present a thin profile for installing on panel 42. The attachment enclosure 40, panel 42, heat exchanger 50, piping 300 and fans 202, 202' then installs on a rack enclosure (not shown).

Figure 7:
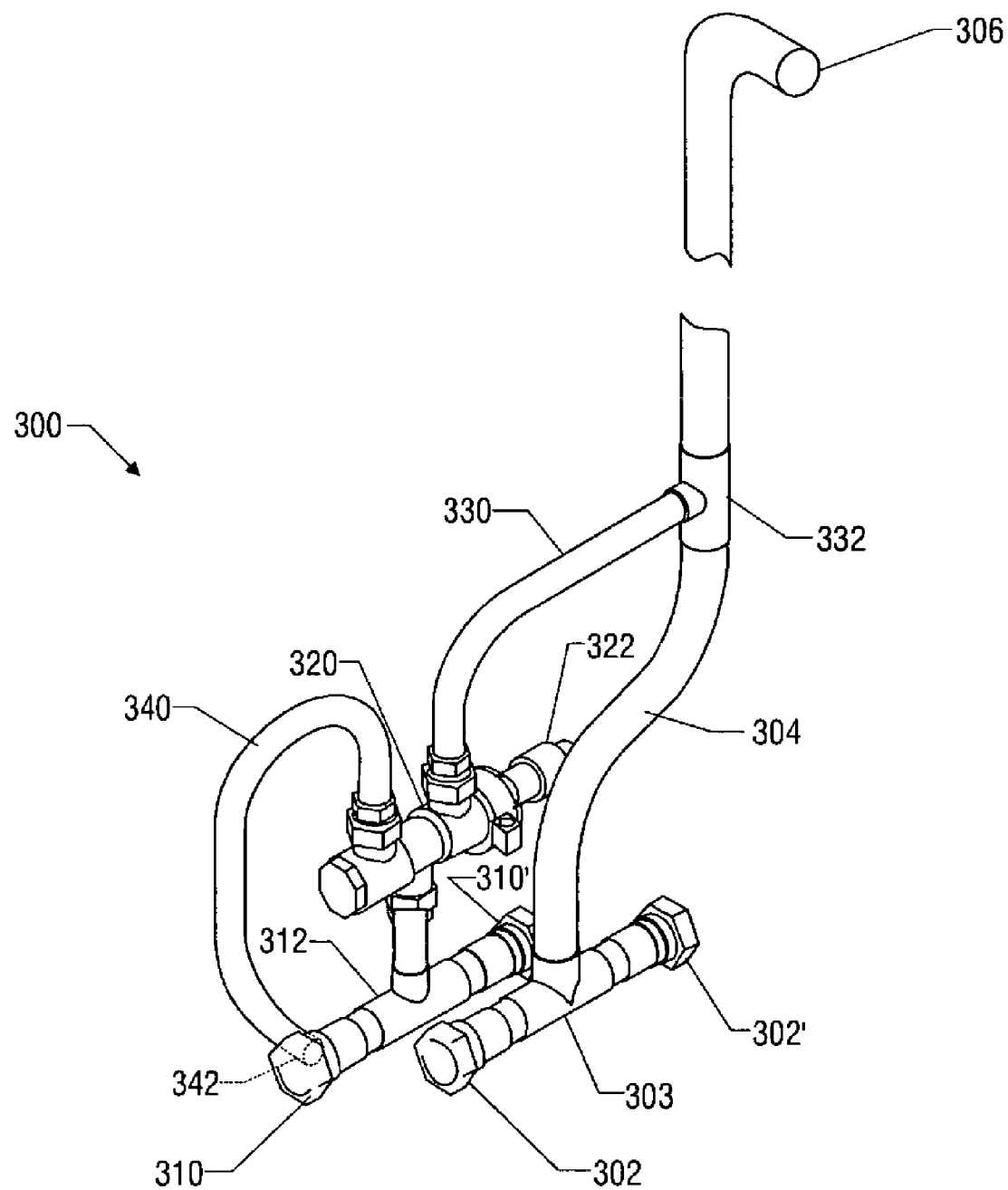
FIG. 7 illustrates an embodiment of a modulating valve and piping arrangement according to the present invention.

FIG. 7 illustrates an embodiment of a modulating valve and piping arrangement 300 according to the present invention. Adapters 302, 302' attach to an external cooling source (not shown). The external cooling source supplies cooling fluid, such as water, glycol or dielectric fluid, to the heat exchanger (not shown). A tee 303 connects adapters 302, 302' to supply line 304. Supply line 304 has connection end 306 that connects to the heat exchanger as shown in FIG. 6B.

After passing through the heat exchanger and absorbing heat, cooling fluid leaves the heat exchanger through return line 340. A return opening 342 on return line 340 connects to the heat exchanger and receives the heated cooling fluid. Return line 342 connects to one coupling of a modulating valve or thermostatic valve 320. Thermostatic valve 320 also has a second pipe, a supply pipe 330, attached. Supply pipe 330 connects the thermostatic valve to supply line 304.

Thermostatic valve 330 has a thermostatic operator 322 that changes the valve position according to temperature control. A temperature sensor and other required controls (not shown) operate thermostatic valve 330. The valve controls the flow of cooling fluid in the heat exchanger and ensures that the air exiting the heat exchanger is at the same temperature as the room temperature of the computer room in which the enclosure is housed. Thermostatic valve 320 attaches to a tee coupling 312 that connects the valve to adapters 310, 310'. Adapters 310, 310' connect to the external cooling source and returns cooling fluid to the external cooling source.

Figure 8:
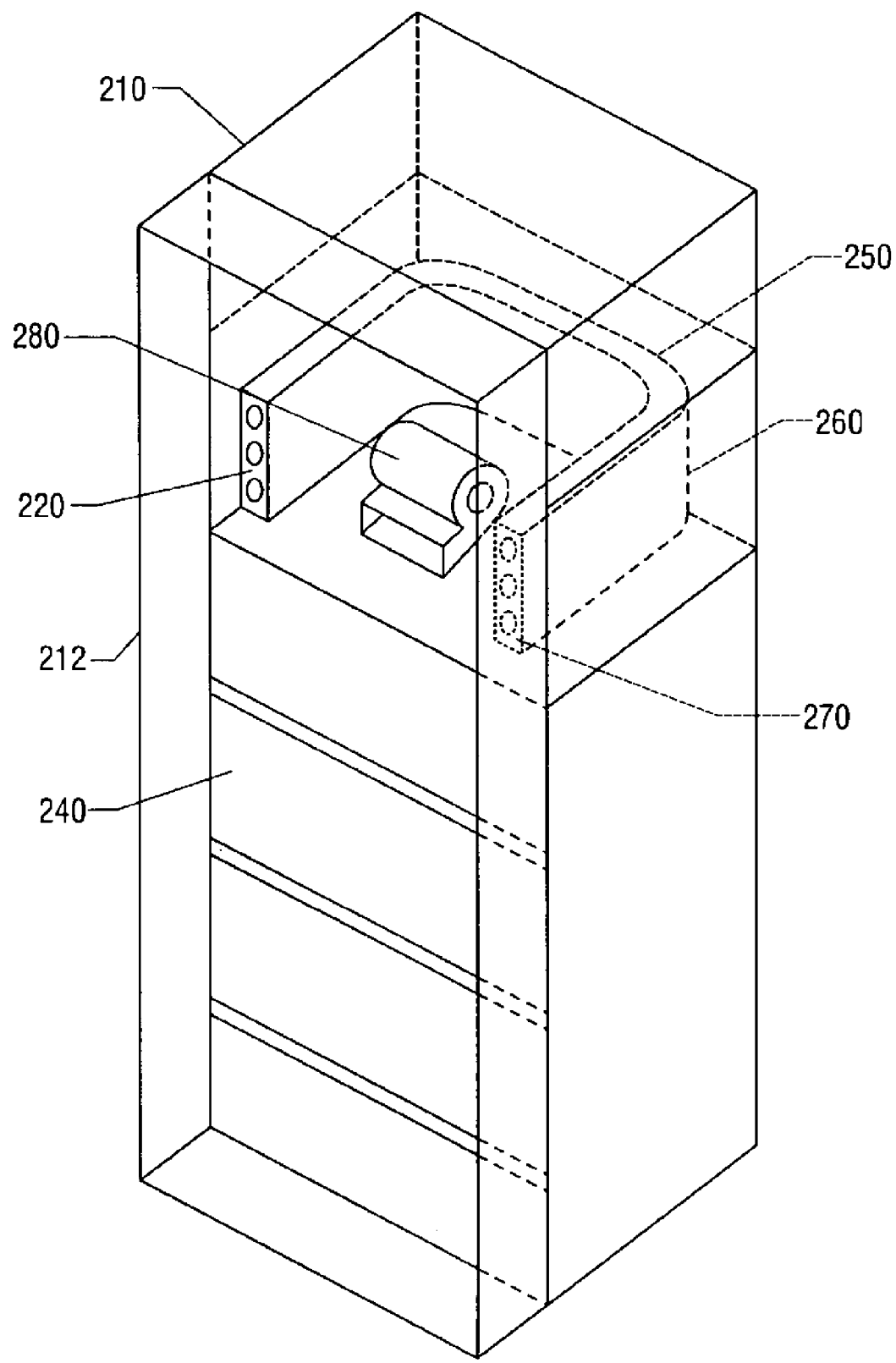
FIG. 8 illustrates another embodiment of the present invention.

Another embodiment of the invention is illustrated in FIG. 8. In this embodiment, cooling apparatus 250 is contained within cabinet 210 and mounted on rack 220. The general principles of operation of this embodiment are substantially the same as the embodiments discussed above, however, the airflow path is different. In the airflow path of the present embodiment, air is drawn in through the front 212 of enclosure 210. After passing through electronics 240 and absorbing heat therefrom, the air passes through the interior of enclosure 210 and is drawn back through cooling apparatus 250. Cooling apparatus 250, which operates in the same manner as described for the previous embodiment absorbs the heat from the air flow and rejects this heat into the cooling fluid delivered to the external source (not shown). Blower 280 draws air through the cooling apparatus, which may be of the designs that are known in the art. The cooled air then returns to electronics 240 again traveling through enclosure 210.

In this embodiment, the cooling apparatus of the present invention allows the electronics enclosure 210 to present a neutral heat load to the computer room by keeping the heated air contained within the enclosure. The heat produced by electronic equipment 240 within enclosure 210 is ultimately rejected outside the room by the cooling fluid.

Additional modifications and adaptations of the present invention will be obvious to one of ordinary skill in the art, and it is understood that the invention is not to be limited to the particular illustrative embodiments set forth herein. It is intended that the invention embrace all such modified forms as come within the scope of the following claims.

What is claimed is:

1. An enclosure containing heat-producing equipment, comprising:
    an air inlet for admitting ambient air from an environment containing the enclosure, the air from the environment being at an ambient temperature, the equipment being situated relative to the air inlet such that the air absorbs heat from the equipment, thereby increasing the temperature of the air to a second temperature;
    an air outlet for expelling the air heated to the second temperature from the enclosure;
    an air-to-liquid heat exchanger mounted on an outside surface of the enclosure adjacent to the air outlet, the heat exchanger connected to an external cooling source and configured such that heat added by the equipment to the air exiting the enclosure is absorbed by the heat exchanger and is expelled outside the environment containing the enclosure and lowers the temperature of the air to the ambient temperature;
    a modulating valve for regulating cooling liquid flow through the heat exchanger; and
    a temperature sensor for sensing temperature of the air and a temperature controller for modulating the valve in response to the temperature of the air.

2. The enclosure of claim 1, further comprising a fan disposed to force air through the heat exchanger.

3. The enclosure of claim 2, wherein the fan is selected from the group consisting of a centrifugal blower, a crossflow blower, an axial fan and a plug fan.

4. A cooling system for an enclosure containing heat-producing equipment, comprising:
    an air inlet defined by the enclosure for admitting ambient air at an ambient temperature from an environment containing the enclosure, the air absorbing heat from the equipment;
    an air outlet defined by the enclosure for expelling the heated air from the enclosure;
    a first heat exchanger configured to have a cooling liquid flowing therein, the first heat exchanger being attached to an outside of the enclosure proximate the air outlet and configured to remove heat added by the equipment from the air expelled from the enclosure with the cooling liquid to cool the heated air exiting from the first heat exchanger to the ambient temperature;
    a second heat exchanger located outside the environment containing the enclosure, the second heat exchanger receiving the cooling liquid from the first heat exchanger such that heat absorbed from the equipment is expelled outside the environment containing the enclosure;
    a modulating valve for regulating cooling liquid flow through the first heat exchanger; and
    a temperature sensor for sensing temperature of the air and a temperature controller for modulating the valve in response to the temperature of the air.

5. The cooling system of claim 4, further comprising a fan for moving the air through the first heat exchanger.

6. A method for cooling an enclosure containing heat-generating equipment, the method comprising:
    drawing ambient air into the enclosure at a first temperature from an environment containing the enclosure;
    passing the air in the vicinity of the heat-generating equipment to absorb heat from the equipment, thus increasing the temperature of the air to a second temperature;
    passing the air heated to the second temperature through an air-to-liquid heat exchanger mounted outside of and on the enclosure, and configured to transfer heat added by the equipment to the air exiting the enclosure to a cooling liquid;

returning the air to the environment containing the enclosure after the cooling liquid has absorbed heat therefrom to return the air to the first temperature level;

rejecting heat from the cooling liquid outside the environment containing the enclosure; and modulating the cooling liquid flow through the heat exchanger so as to regulate the temperature of the air returned to the environment.

7. A method for cooling an enclosure containing heat-generating equipment, the method comprising:

drawing ambient air at an ambient temperature into the enclosure from an environment containing the enclosure;

passing the air in the vicinity of the heat-generating equipment to absorb heat from the equipment;

passing the heated air through an air-to-liquid heat exchanger mounted outside of and on the enclosure and configured to transfer heat added to the air by the equipment to a cooling liquid;

returning the air to the environment containing the enclosure after the cooling liquid has absorbed heat from the air to cool the air down to the ambient temperature;

flowing the cooling liquid to an external cooling source located outside the environment containing the enclosure so that the absorbed heat is expelled outside the environment containing the enclosure; and modulating cooling liquid flow through the heat exchanger so as to regulate the temperature of the air returned to the environment.

8. A cooling system for an enclosure containing heat-producing equipment, comprising:

an air inlet for admitting ambient air from an environment containing the enclosure, the air from the environment being at a first temperature, the equipment being situated relative to the air inlet such that the air absorbs heat from the equipment thereby increasing the temperature of the air to a second temperature;

an air-to-liquid heat exchanger mounted on an outside surface of the enclosure such as to contact the air heated to the second temperature and configured to return the air to the first temperature, the heat exchanger connected to an external cooling source such that heat absorbed by the heat exchanger is expelled outside the environment containing the enclosure;

a modulating valve for regulating cooling liquid flow through the heat exchanger; and a temperature sensor for sensing temperature of the air and a temperature controller for modulating the valve in response to the temperature of the air.

9. A method for cooling an enclosure containing heat-generating equipment, the method comprising:

drawing ambient air at a first temperature into the enclosure from an environment containing the enclosure;

passing the air in the vicinity of the heat-generating equipment to absorb heat from the equipment, thus increasing the temperature of the air to a second temperature;

passing the air heated to the second temperature through an air-to-liquid heat exchanger mounted on and outside of the enclosure and configured to reduce the temperature of the air to the first temperature by transferring heat to a cooling liquid;

allowing the air to return to the environment containing the enclosure after the cooling liquid has absorbed heat from the air;

flowing the cooling liquid to an external cooling source located outside the environment containing the enclosure so that the absorbed heat is expelled outside the environment containing the enclosure; and modulating the cooling liquid flow through the heat exchanger so as to regulate the temperature of the air returned to the environment.

* * * * *